(12) United States Patent
Reisinger

(10) Patent No.: US 7,800,237 B2
(45) Date of Patent: Sep. 21, 2010

(54) ELECTRONIC DEVICE INCLUDING A COMPONENT STACK AND CONNECTING ELEMENTS, AND CONNECTING ELEMENTS, AND METHOD FOR PRODUCING THE ELECTRONIC DEVICE

(75) Inventor: Jochen Reisinger, Villach (AT)

(73) Assignee: Infineon Technologies AG, Neubiberg (DE)

( * ) Notice: Subject to any disclaimer, the term of this patent is extended or adjusted under 35 U.S.C. 154(b) by 44 days.

(21) Appl. No.: 11/764,898

(22) Filed: Jun. 19, 2007

(65) Prior Publication Data

US 2007/0290365 A1 Dec. 20, 2007

(30) Foreign Application Priority Data

Jun. 20, 2006 (DE) .................. 10 2006 028 719

(51) Int. Cl.
*H01L 23/52* (2006.01)
(52) U.S. Cl. .............. 257/777; 257/E23.052; 257/E23.124; 257/E25.013; 257/E21.705; 257/686; 257/685; 257/773; 257/774
(58) Field of Classification Search .......... 257/734, 257/777, 786, 723, 686, 685, E21.705, E23.052, 257/E23.124, E25.013, 774, 773
See application file for complete search history.

(56) References Cited

U.S. PATENT DOCUMENTS

| 4,364,064 | A | * | 12/1982 | Baues | 347/241 |
| 4,937,653 | A | | 6/1990 | Blonder et al. | |
| 5,517,752 | A | | 5/1996 | Sakata et al. | |
| 5,583,384 | A | * | 12/1996 | Henry | 307/113 |
| 5,821,625 | A | | 10/1998 | Yoshida et al. | |
| 5,956,606 | A | | 9/1999 | Burnette | |
| 6,088,236 | A | | 7/2000 | Tomura et al. | |
| 6,225,206 | B1 | | 5/2001 | Jimarez et al. | |
| 6,232,668 | B1 | | 5/2001 | Hikita et al. | |
| 6,239,366 | B1 | | 5/2001 | Hsuan et al. | |
| 7,425,747 | B2 | * | 9/2008 | Watanabe et al. | 257/379 |
| 2004/0262753 | A1 | | 12/2004 | Kashiwazaki | |
| 2005/0127490 | A1 | * | 6/2005 | Black et al. | 257/686 |

FOREIGN PATENT DOCUMENTS

JP 62004353 1/1987

OTHER PUBLICATIONS

Wolf et al., Silicon Processing for the VLSI Era, 2000, Lattice Press, vol. 1, pp. 435-437.*

* cited by examiner

*Primary Examiner*—Alexander O Williams
(74) *Attorney, Agent, or Firm*—Edell, Shapiro & Finnan, LLC

(57) ABSTRACT

An electronic device includes a stack of electronic components and connecting elements. The component stack includes two components stacked one on top of another by their top sides. Contact areas are arranged on the top sides of the components, and the contact areas include external contact structures as connecting elements. The external contact structures on the contact areas include rib and/or trench structures oriented in such a way that the rib and/or trench structures of the contact areas of the components stacked one on top of another cross or intersect each other.

16 Claims, 12 Drawing Sheets

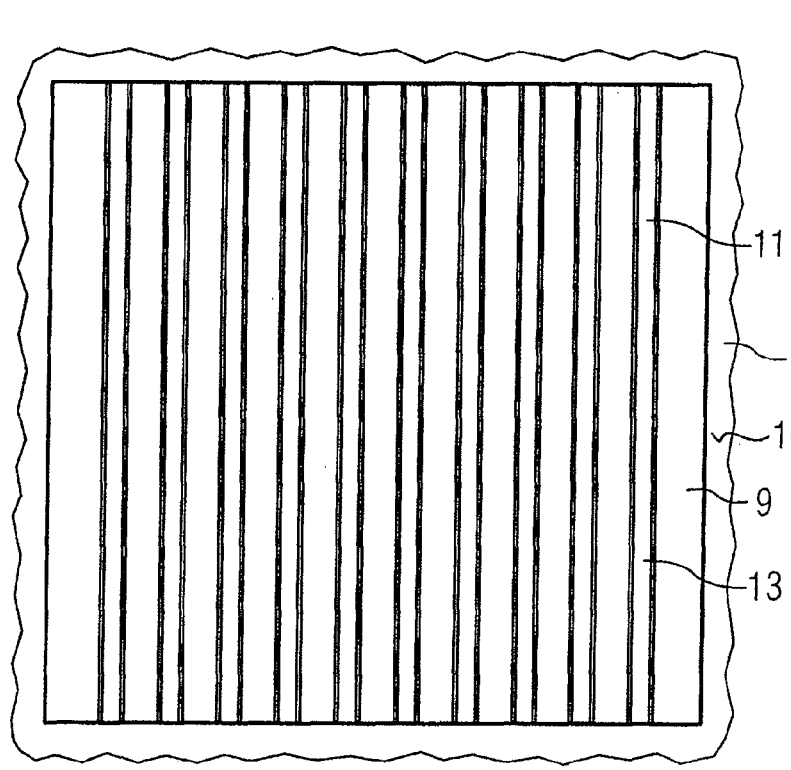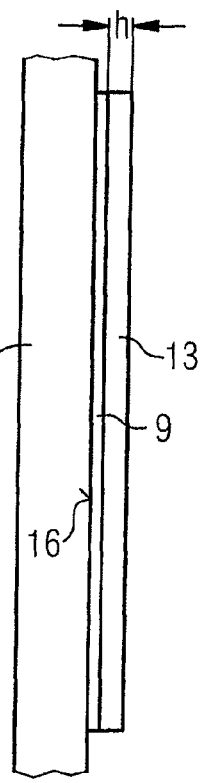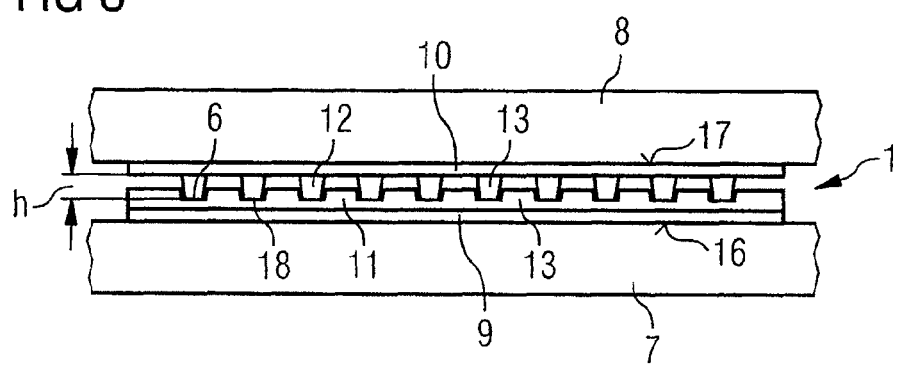

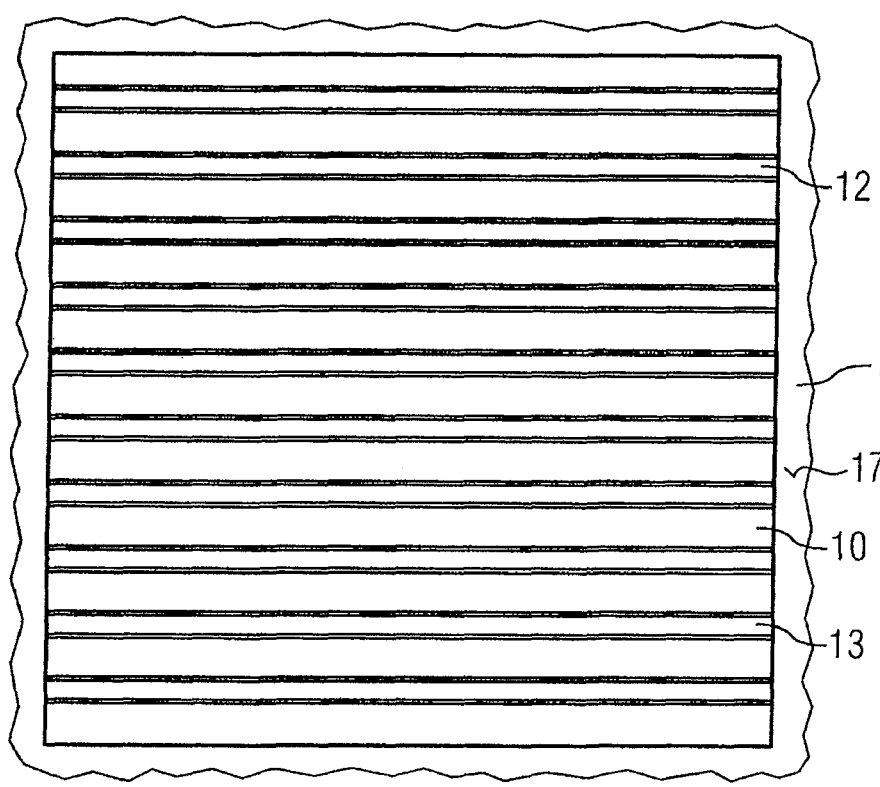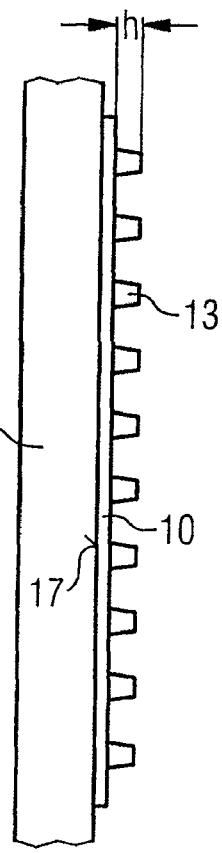

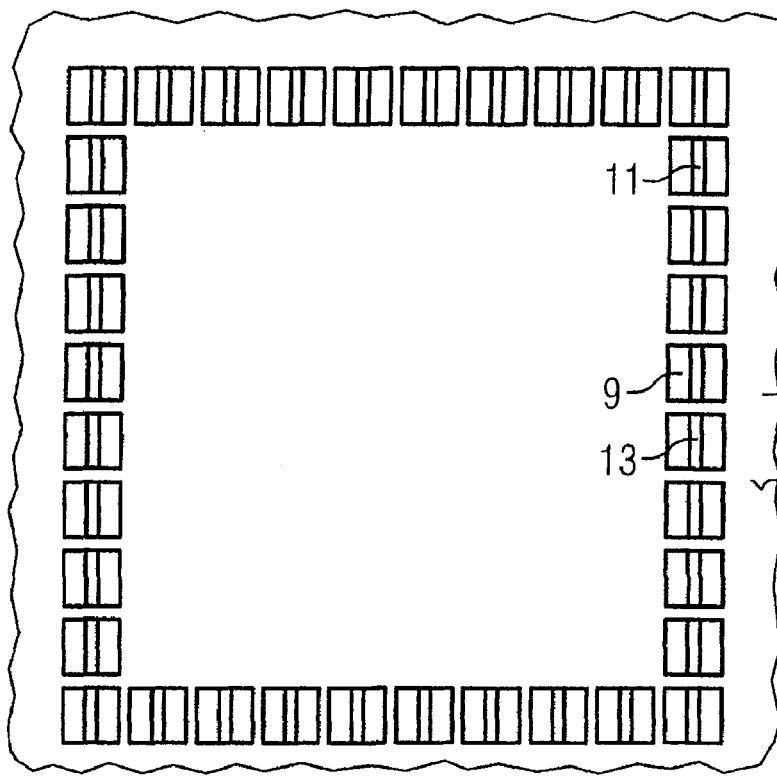
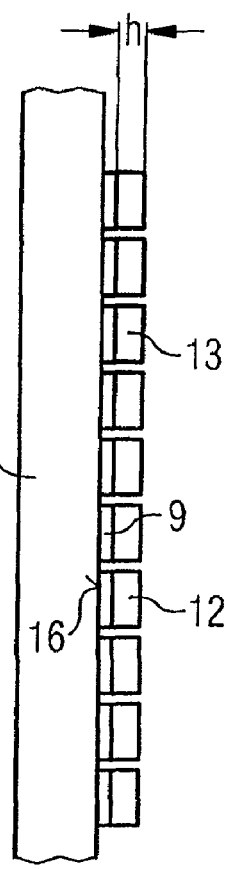
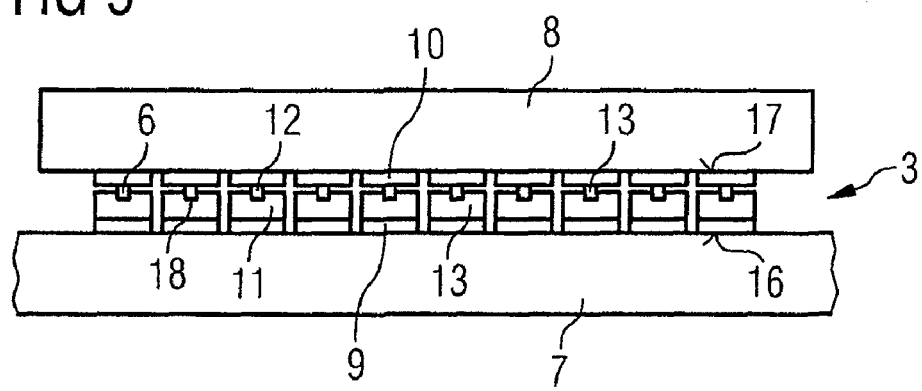

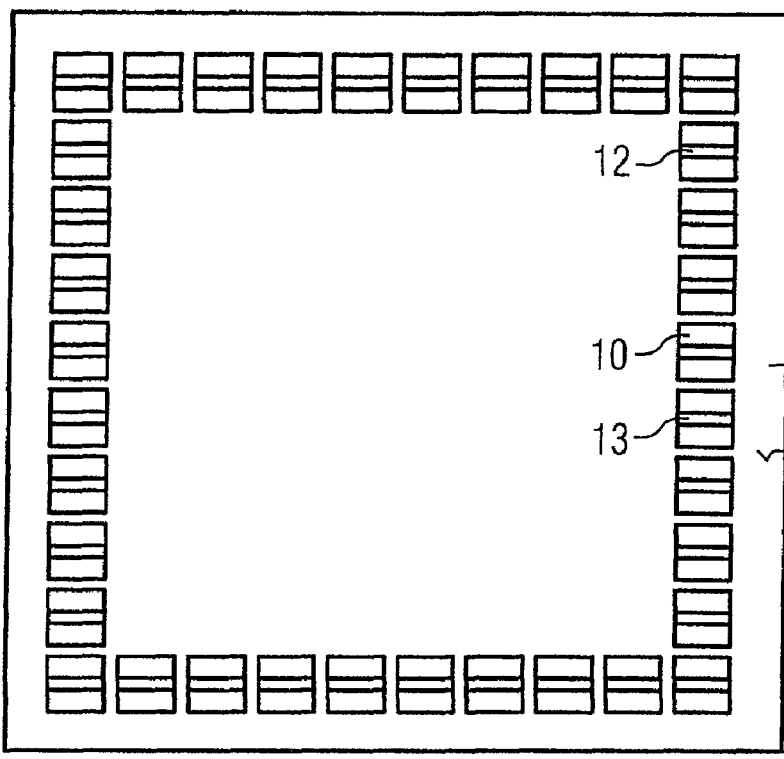
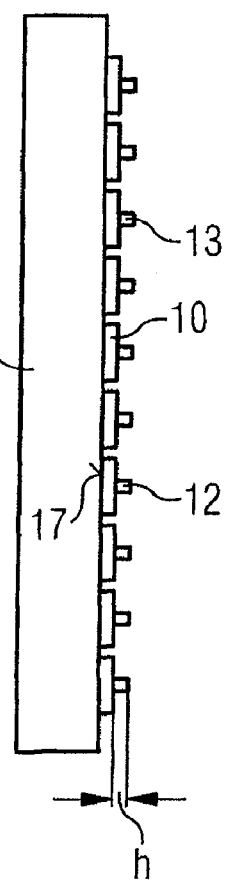

ELECTRONIC DEVICE INCLUDING A COMPONENT STACK AND CONNECTING ELEMENTS, AND CONNECTING ELEMENTS, AND METHOD FOR PRODUCING THE ELECTRONIC DEVICE

CROSS REFERENCE TO RELATED APPLICATIONS

This application claims priority under 35 USC §119 to German Application No. DE 10 2006 028 719.3, filed on Jun. 20, 2006, and titled "Semiconductor Device Comprising a Semiconductor Chip Stack and Connecting Elements, and Method For Producing the Semiconductor Device," the entire contents of which are hereby incorporated by reference.

FIELD OF THE INVENTION

The invention relates to an electronic device (e.g., a semiconductor device) comprising a chip stack and connecting elements.

BACKGROUND

A semiconductor component comprising a semiconductor chip stack in which semiconductor chips are arranged with their top sides lying opposite is known. Between the two top sides of the semiconductor chips stacked one on top of another, metallic leads are arranged on an intermediate carrier connecting the contact areas of the base semiconductor chip to the contact areas of the stacked semiconductor chip. Consequently, for stacking purposes, the leads have to be bonded by their lead ends on the contact areas of the semiconductor chips to be stacked one on top of another, which can lead to problems at least during the bonding of the stacked semiconductor chips on the lead ends. It is furthermore disadvantageous that a special lead frame has to be produced for the stacking of the semiconductor chips whose top sides are oriented to one another, where the costs for producing a semiconductor component of this type rise.

A semiconductor component is known that includes a semiconductor component comprising semiconductor chips that are stacked one on top of another with their top sides lying opposite. For this purpose, the top sides have contact areas and external contacts in the form of solder balls which are soldered onto one another in order to realize a semiconductor chip stack for the semiconductor component. A semiconductor component of this type has the disadvantage that the solder balls as flip-chip contacts increase the device height and the further disadvantage that the orientation of the semiconductor chips with respect to one another is complicated and can lead to incorrect connections, especially as a reliable meeting of flip-chip contacts of the semiconductor chips to be stacked one on top of another is extremely difficult and appears to be relatively unsuitable for mass production.

SUMMARY

The present invention provides an electronic device (e.g., a semiconductor device) comprising a component stack (e.g., a semiconductor chip stack) and connecting elements which achieve a number of different advantages and can be configured to overcome a number of disadvantages including, without limitation, the disadvantages noted above. The present invention further provides connecting elements which can be suitably configured to enable a reliable and cost-effectively producible stacking of chips for an electronic device comprising a chip stack.

In an exemplary embodiment of the invention, an electronic device (e.g., a semiconductor device) is provided comprising a stack of electronic components or a component stack (e.g., a semiconductor chip stack) and connecting elements. The component stack includes two electronic components (e.g., semiconductor chips) which are stacked one on top of another by their top sides and on the top sides of which contact areas are arranged. The contact areas include external contact structures as connecting elements, wherein the external contact structures on the contact areas include rib and/or trench structures. These rib and/or trench structures of stacked chips are oriented with respect to one another in such a way that the rib and/or trench structures of the contact areas of the two chips stacked one on top of another by their top sides cross one another.

In another exemplary embodiment of the invention, a method for producing an electronic device (e.g., a semiconductor device) comprising a stack of electronic components or a component stack (e.g., a semiconductor chip stack) includes the following method steps. Wafers are produced including a plurality of device positions (e.g., semiconductor device positions), wherein the device positions include contact areas on the top side of the wafers. This is followed by patterning the contact areas with external contact structures by etching trench structures into the contact area material and/or applying rib structures to the contact areas. The wafers can then either be separated into individual components (e.g., semiconductor chips), or individual components are stacked on a base wafer in device positions and only afterward is the base wafer separated into component stacks. The wafer for the base component can also be a carrier without an active function, for example, to connect a plurality of stacked components in a system housing on the base component, or in order to achieve a so-called "fan out" with the base component.

The above and still further features and advantages of the present invention will become apparent upon consideration of the following detailed description of specific embodiments thereof, particularly when taken in conjunction with the accompanying drawings wherein like reference numerals in the various figures are utilized to designate like components.

BRIEF DESCRIPTION OF THE DRAWINGS

FIG. 2A shows a schematic plan view of a contact area with external contact structure of a base chip for the power semiconductor chip stack.

FIG. 2B shows a schematic side view of the external contact structure of the base chip of FIG. 2A.

FIG. 3 shows a schematic cross section through a power semiconductor chip stack formed with the chips of FIGS. 1 and 2.

FIG. 4A shows a schematic plan view of a contact area with external contact structure of a power semiconductor chip to be stacked for a power semiconductor chip stack of a second embodiment.

FIG. 4B shows a schematic side view of the external contact structure of the semiconductor chip of FIG. 4A.

FIG. 8A shows a schematic plan view of a base chip with a plurality of contact areas of a semiconductor chip stack for signal transmission in accordance with the third embodiment.

FIG. 8B shows a schematic side view of the base chip of FIG. 8A.

FIG. 9 shows a schematic cross section through a semiconductor chip stack formed with the chips of FIGS. 7 and 8.

FIG. 10A shows a schematic plan view of a semiconductor chip to be stacked with contact areas for a semiconductor chip stack of a fourth embodiment.

FIG. 10B shows a schematic side view of the semiconductor chip of FIG. 10A.

DETAILED DESCRIPTION

Figure 1A:
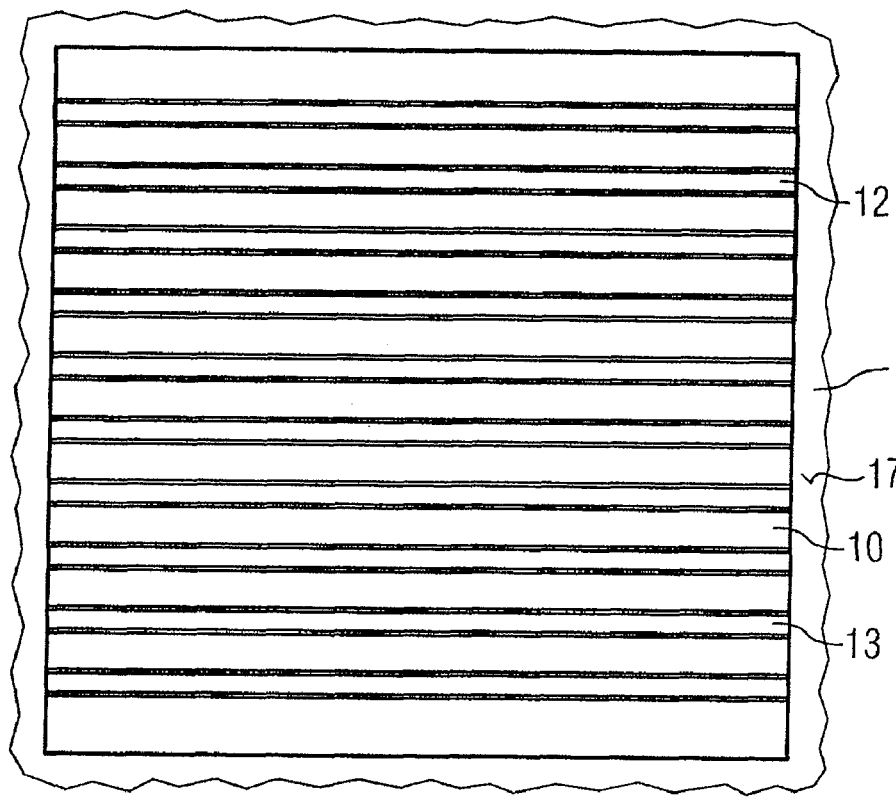
FIG. 1A shows a schematic plan view of a contact area with external contact structure of a power semiconductor chip to be stacked for a power semiconductor chip stack.

An electronic device, such as a semiconductor device, is provided comprising a stack of electronic components or a component stack (e.g., a semiconductor chip stack) and connecting elements. The exemplary embodiments described herein are in relation to semiconductor devices with stacked semiconductor chips. However, it is noted that the invention is not limited to the exemplary embodiments, but rather encompasses any electronic devices with stacked electronic components.

A semiconductor chip stack includes two semiconductor chips which are stacked one on top of another by their top sides and on the top sides of which contact areas are arranged. The contact areas include external contact structures as connecting elements, wherein the external contact structures on the contact areas include rib and/or trench structures. These rib and/or trench structures of stacked semiconductor chips are oriented with respect to one another in such a way that the rib and/or trench structures of the contact areas of the two semiconductor chips stacked one on top of another by their top sides cross one another.

The semiconductor chip stack is provided with a reliable and stable connection between the contact areas since, on account of the rib and/or trench structure of the external contact structures of the two semiconductor chips, a high tolerance range is provided for the orientation of the semiconductor chips with respect to one another, such that manufacturing tolerances in semiconductor chip production cannot lead to failures during stacking. Moreover, reliable cohesive connections arise at the crossover points of the rib structure between the two stacked semiconductor chips, and enable a low-impedance coupling of the two semiconductor chips one above another.

A system comprising stacked chips in the housing, so-called SiP (System in Package) technology, has the advantage over the system with different functions on a chip, so-called SoC (System on Chip) technology, of a smaller space requirement on superordinate circuit boards. Furthermore, the variability of SiP technology is significantly greater. Thus, given identical silicon technology for the base chip and the stacked chip, it is possible to achieve a functional enhancement, a reduction of the printed circuit board area and/or improved reuse of finished chip designs. Moreover, other chip technologies can be combined with a base chip by stacking, such as HF chips, sensor chips, power chips, MEM chips, chips with a different voltage supply, chips for analog processes stacked on base chips for digital processes, and vice versa, memory chips such as RAM, ROM, flash on analog and/or digital chips. Furthermore, it is possible also to stack passive components on the base chip.

Independently of the surface structure of the contact areas, it is possible to arrange contact areas on the chip to be stacked in a manner distributed annularly, linearly or nonuniformly on a chip surface. It is advantageously possible to stack a plurality of semiconductor chips and/or passive components onto a base chip to form a circuit module.

It is also advantageous that no additional leads and/or solder balls have to be arranged between the semiconductor chip surfaces in order to electrically connect the contact areas of the two stacked semiconductor chips to one another. Further, it is advantageous that, on account of the crossover points between the external contact structures on the contact areas of the two semiconductor chips, when the semiconductor chip stack is pressed together, a boosted pressure occurs at the crossover points and provides for a plastic deformation of the ribs in the crossover points, thereby achieving an intensive mixing and contacting of the materials of the external contact structures on the contact areas. The areas of contact at the crossover points become larger, the smaller the angle between the rib structures of the two semiconductor chips. There is therefore the possibility of optimizing the contact resistance between the connected external contact structures.

This type of stacking with direct contact of the contact areas using rib structures of this type is particularly advantageous for the area of application of extremely high frequency technologies. In practice, no lines whatsoever are required in order to connect a base semiconductor chip to the contact areas of a stacked semiconductor chip of the extremely high frequency technology by means of contact areas prepared in this way.

The angle at which the rib and/or trench structures on the contact areas of the two semiconductor chips stacked one on top of another by their top sides are oriented with respect to one another preferably lies between $0°<\alpha\leqq90°$. This angle ensures that crossover points form whose area of contact becomes smaller as the angle increases.

In an exemplary embodiment, semiconductor chips for signal processing are stacked one on top of another. In this case, the semiconductor chips have a multiplicity of contact areas for signal transmission, wherein the two semiconductor chips stacked one on top of another by their top sides have at least per contact area one rib as external contact structure which is arranged diagonally on a square or rectangular contact area. The diagonal arrangement is associated with the advantage that it is thereby possible to realize the greatest possible length of a rib on a contact area.

It is also possible to provide an individual rib on a contact area provided for signal transmission as connecting element which is arranged parallel to a lateral edge of the square or rectangular contact areas. In this case, when the semiconductor chips and thus the contact areas are superimposed, the result is a mutually right-angled crossing of the ribs which have a crossover point which cohesively connects the materials of the ribs even at low pressure.

If, by contrast, the contact areas are provided for power transmission of the two semiconductor chips stacked one on top of another by their top sides, then said contact areas have a multiplicity of crossing ribs as external contact structure. Since the areal extent of the contact areas is relatively large in the case of power transmission, it is also possible to realize a high number of crossing ribs in such a stack of power semiconductor chips.

The contact areas and/or the external contact structures of the two semiconductor chips stacked one on top of another by their top sides can include an aluminum alloy comprising alloying elements, the alloying elements preferably comprising silicon and/or copper. The aluminum is relatively soft and ductile, with the result that an intimate intermeshing is possible upon pressing together the ribs made from an aluminum alloy. Furthermore, the rib structure makes it possible, particularly in the case of a thermosonic bonding method, for the thin unavoidable aluminum oxide skin to be rubbed down relatively without any problems, so that the aluminum alloys can fuse together at the crossover points.

In another embodiment, the contact areas and/or the external contact structures of a base chip of the semiconductor chip stack stacked one on top of another by their top sides have an aluminum alloy and the contact areas and/or the external contact structures of the stacked semiconductor chip have a gold alloy. This combination of gold alloy and aluminum alloy has the advantage that at low temperature a eutectic melt forms during bonding or during joining from gold and aluminum, which is associated with the advantage that the crossed structures are electrically connected via a eutectically fused metal alloy.

The external contact structures can include ribs having a conical or tapered cross section, such that the cross section becomes wider toward the base of the ribs (i.e., the side walls of each tapered contact structure are nonparallel with respect to each other such that the cross-sectional profile of the contact structure tapers from the base of the contact structure to a free end of the contact structure). The tapered external contact structure configuration results in an area of contact at the start of a joining operation between the ribs lying one on top of another at the crossover point being small so as to facilitate the joining of the external contact structures. In one preferred embodiment of the invention, the height h with which the external contact structures project beyond the contact areas lies between $0.05~\mu m\leqq h\leqq100~\mu m$ preferably between $0.1~\mu m\leqq h\leqq5~\mu m$.

The semiconductor device can be used for extremely high frequency circuits, especially as there is no need for long connecting lines or connecting elements in order to electrically connect a semiconductor chip for extremely high frequencies to a semiconductor chip with control, supply, logic and/or memory functions. Since the areal extent of the semiconductor chip for extremely high frequency components is significantly smaller in comparison with a base chip of the semiconductor chip stack with control, supply, logic and/or memory circuits, the semiconductor chip for an extremely high frequency circuit can be introduced in that region on the base chip which is intended to be operatively connected to the semiconductor chip for extremely high frequency applications. This need not necessarily be the center of a base chip, but rather may in many applications also mean an eccentric position on the base semiconductor chip.

A further use of a semiconductor device of this type is afforded for FET power switches and/or FET bridge circuits, wherein the large-area contact regions of a source connection or of a drain connection enable external contact structures on the contact areas with a multiplicity of ribs.

An exemplary method for producing an electronic device such as a semiconductor device comprising a semiconductor chip stack includes the following method steps. The first step involves producing wafers including a plurality of semiconductor device positions, wherein the semiconductor device positions have contact areas on the top side of the wafers. This is followed by patterning the contact areas with external contact structures by etching trench structures into the contact area material and/or applying rib structures to the contact areas. The wafers can then either be separated into individual semiconductor chips, or individual semiconductor chips are stacked on a base wafer in semiconductor device positions and only afterward is the base wafer separated into chip stacks. In this case, the wafer for the base chip can also be a carrier without an active function, for example, to connect a plurality of stacked semiconductor chips in a system housing on the base chip, or to achieve a so-called "fan out" with the base chip.

Semiconductor chips can subsequently be stacked one on top of another by their top sides, wherein the external contact structures are oriented in such a way that they cross one another or intermesh and join cohesively to one another with application of pressure. After the production of the chip stacks, the chip stacks of semiconductor chips are electrically connected to a device substrate or a lead frame. The semiconductor chip stack can then be incorporated by means of device substrate or lead frame into a housing to form a semiconductor device or remain unencapsulated as an open module.

This method provides a number of advantages including, without limitation, the advantage that it is possible to produce cost-effectively chip stacks that are connected to one another without the use of solder balls or interposed lead carriers. Rather, the contact areas prepared with rib or trench structures are cohesively connected to one another directly by the crossover points of the crossing ribs. Alongside stacked chips, it is also possible to apply to the base chip other components, such as resistors, inductances or capacitors, which can additionally be operatively connected to the base chip by other connecting technologies, such as bonding wires.

Since the patterning of the contact area materials can also take place on semiconductor wafers, a multiplicity of contact areas can be prepared correspondingly before the semiconductor chip stacks are produced by joining the external contact structures on contact areas. One possibility for patterning comprises etching trenches into the contact material of the contact areas. Wet etching techniques and dry etching techniques are available for such etching of trenches, plasma etching preferably being used, in which an anisotropic removal of the contact area material to be etched takes place and it is thus possible to produce extremely narrow ribs from the contact area material.

A further possibility for producing rib structures on the contact areas comprises producing a metal layer by a PVD method (physical vapor deposition), preferably made from an aluminum alloy onto the contact areas with subsequent etching or subsequent laser removal for patterning the ribs. In this case, the etching of the applied metal layer can be achieved in the same way as above during the production of trenches in the contact area material. The laser removal technique has the advantage of an anisotropic removal of the material.

In an exemplary embodiment, the rib structures are produced using printing methods, such as screen printing methods, stencil printing methods and/or jet printing methods. The resultant ribs cannot be patterned as finely as in the case of anisotropic etching methods and/or during the anisotropic laser removal, but printing methods of this type permit a high throughput and hence mass production of correspondingly patterned contact areas on a semiconductor wafer, preferably a power semiconductor wafer.

Moreover, it is also possible to apply the rib structures by electrodeposition or chemical deposition onto the contact connection areas. This results in the production of a very fine rib structure.

When stacking the two semiconductor chips by their top sides, the contact areas can be oriented with the crossing rib structures to one another and cohesively connecting the rib structures to one another in the region of crossover points at elevated pressure and elevated temperature. The elevated temperature improves the intensive cohesive bond between the two contact area structures and thus increases the reliability of the semiconductor device and its service life.

In another exemplary embodiment, the semiconductor chips are coated prior to stacking with an adhesive composition in such a way that the rib structures of the external contact structures are uncovered and project from the adhesive layer. In this case, care is taken to ensure that the projecting external contact structures intermesh during stacking in such a way that the adhesive layers can additionally form a cohesive connection with one another. The relatively narrow interspace between the stacked semiconductor chip and the base semiconductor chip is completely filled by the adhesive layer, and the reliability of the electrical connection between the stacked semiconductor chips is additionally improved by a large-area adhesive zone.

A semiconductor base chip whose areal extent is greater than the areal extent of the stacked semiconductor chip can be used for the semiconductor chip stack. In this case, the larger area of the base chip has contact areas outside the stack region of the stacked semiconductor chip. These contact areas on the edge regions of the base semiconductor chip can then be electrically connected to the device substrate via connecting elements. This construction is advantageous since the stacked semiconductor chip is completely supported by the base semiconductor chip. Moreover, it is advantageous that the same semiconductor material, such as silicon, can be used for the base semiconductor chip and the stacked semiconductor chip, with the result that there are no thermal stress problems either, which problems occur when semiconductor chips are connected to one another by circuit boards or are electrically connected to one another by an interposer.

It is also possible to stack chips of identical size one on top of another and/or to stack chips one on top of another of which the base chip is smaller than the stacked semiconductor chip, such that the stacked semiconductor chip projects beyond the edges of the base semiconductor chip.

Exemplary embodiments of the invention are explained in greater detail herein with reference to the figures.

Figure 1B:
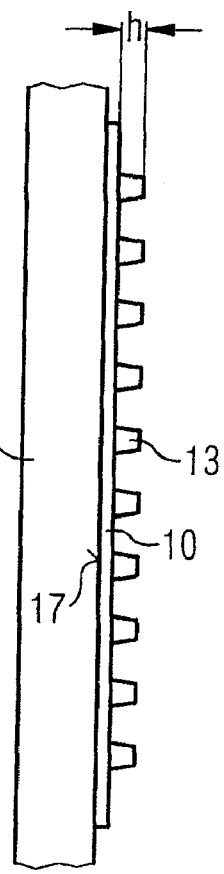
FIG. 1B shows a schematic side view of the external contact structure of the semiconductor chip of FIG. 1A.

FIG. 1A shows a schematic plan view of a contact area 10 with external contact structure 12 of a power semiconductor chip 8 to be stacked. Alongside, FIG. 1B shows the corresponding side view of the semiconductor chip 8 with the patterned contact area 10 on the top side 17 of the power semiconductor chip 8. Power semiconductor chips of this type have contact areas 10, such as a drain connection area, a source connection area, an emitter connection area and/or a collector connection area, which in terms of their areal extent cover one side of the power semiconductor chip 8 in part or completely.

When power semiconductor chips 7 and 8 of this type (as shown in FIGS. 2A, 2B and 3) are stacked to form a semiconductor chip stack, it is important that the metallization of the contact area 10 forms intensive ohmic contacts suitable for carrying high current. In order to produce such high current carrying, the contact areas 10 to be stacked one on top of another have ribs 13, which cover the contact area 10 of the stacked semiconductor chip 8 in strip-type fashion and in this case project with a height h above the contact area 10.

FIG. 2A shows a schematic plan view of a contact area 9 with external contact structure 11 of a base chip 7 for the power semiconductor device stack of the first embodiment of the invention. FIG. 2B shows in respect of this the side view of the base chip 7 with contact area 9 and longitudinal ribs 13, the longitudinal ribs likewise projecting with a height h above the contact area 9. The height h lies between in micrometers $0.5\,\mu m < h \leq 50\,\mu m$. In terms of their orientation, the ribs 13 are displaced transverse (e.g., by an angle α of 90°) relative to the orientation of the ribs 13 in FIG. 1A, with the result that, when the semiconductor chips 7 and 8 are stacked, crossover or intersection points arise which intensively intermesh and cause the material of the ribs 13 to be joined cohesively into one another.

A soft metal, such as an aluminum alloy, is preferably used for these contact areas 9 and 10 with external contact structure 11 and 12, such that, even at low contact pressure, the ribs 13 deform at the crossover or intersection points and produce a cohesive connection. This cohesive connection can be supported and improved by increasing the temperature, preferably in an inert gas furnace or else in a furnace which is flushed with forming gas and the atmosphere of which simultaneously has a reducing effect on account of the hydrogen of the forming gas.

FIG. 3 shows a schematic cross section through a power semiconductor chip stack 1 of the first embodiment of the invention in the region of the contact areas 9 and 10 shown in FIGS. 1 and 2. The patterned contact areas 9 and 10 lie at a topographically higher level than the surroundings of the chip top sides, in particular higher than the interconnects arranged on the chip top sides. By pressing together the contact areas provided with ribs 13, new connecting elements 6 form in crossover or intersection regions 18 and also connect large-area contact areas to one another even when the semiconductor chip top sides are slightly curved. It is also possible to use ultrasonic vibrations, for example, for supporting the connection, in which case the surface pressure can be reduced. The limits of the warpage that can be afforded tolerance are defined by the height h with which the ribs 13 project beyond the contact areas 9 and 10. The formation of external contact structures 11 and 12 on the contact areas 7 and 8 in the form of ribs 13 provides a reliable connecting technique and a reliable connecting element for the power semiconductor chip stack 1.

The angle α, which is 90° in the first embodiment of the invention, need not necessarily be maintained. In principle, it is possible to choose any desired angles α between the two external contact structures 11 and 12 in the range of $0° < α \leqq 90°$ between the rib orientation of the stacked semiconductor chip 8 and the rib orientation of the base chip 7. Preferably, the rib orientations of the two chips are transverse with respect to each other.

FIG. 4A shows a schematic plan view of a contact area 10 with external contact structure 12 of a power semiconductor chip 8 to be stacked for a power semiconductor chip stack of a second embodiment. FIG. 4B shows a corresponding side view. In this case, the structures of FIGS. 4A and 4B correspond to the external contact structures 12 shown in FIGS. 1A and 1B. Components having the same functions as in the previous figures are identified by the same reference symbols in the subsequent FIGS. 4 to 15.

Figure 5A:
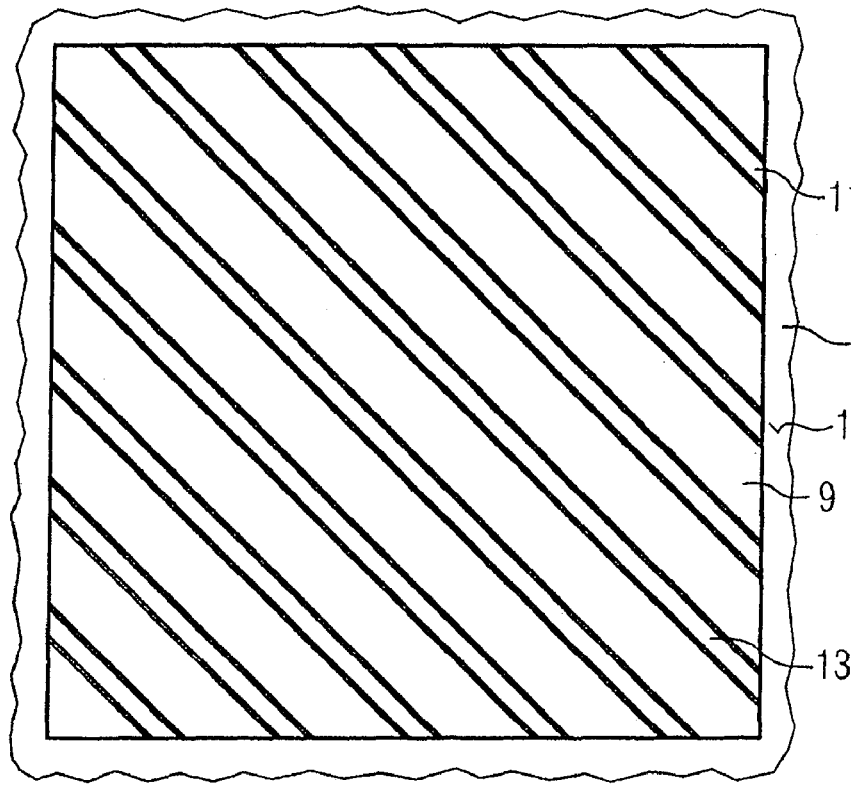
FIG. 5A shows a schematic plan view of a contact area with external contact structure of a base chip for a power semiconductor chip stack of the second embodiment.
Figure 5B:
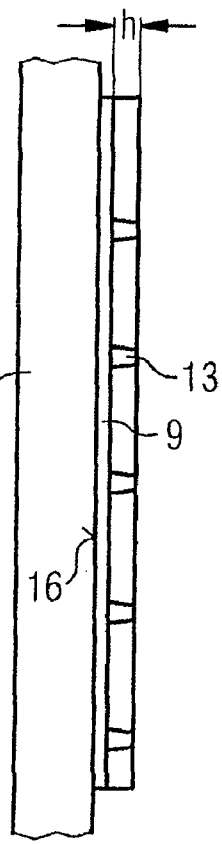
FIG. 5B shows a schematic side view of the external contact structure of the base chip of FIG. 5A.

FIG. 5A shows a schematic plan view of a contact area 9 with external contact structures 11 of a base chip 7 of the power semiconductor chip stack of the second embodiment of the invention, and FIG. 5B shows a corresponding side view in respect thereof. In this second embodiment, the contact area 9 of the base chip 7 has ribs 13 which are arranged obliquely and which have an orientation that is at an angle α of 45° with respect to the orientation of the ribs 13 in FIG. 4A of the stacked semiconductor chip 8. Joining together the ribs 13 of the contact areas 9 and 10 gives rise to connecting elements such as are shown in FIG. 6.

Figure 6:
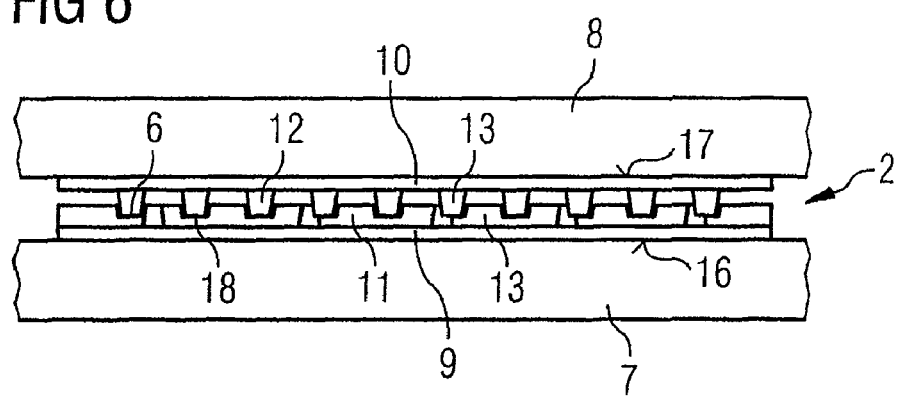
FIG. 6 shows a schematic cross section through a power semiconductor chip stack formed with the chips of FIGS. 4 and 5.

FIG. 6 shows a schematic cross section through the power semiconductor chip stack 2 of the second embodiment in the region of the contact areas 9 and 10 shown in FIGS. 4 and 5. Since the ribs 13 of the base chip 7 run obliquely, this results in a larger contact area at the crossover or intersection points between the rib structures of the stacked semiconductor chip 8 and the base semiconductor chip 7, which is associated with a further reduction of the contact resistance. However, the formation of patterned contact areas 9 and 10 is advantageous not only for power semiconductor chips, but also for signal processing chips, such as are used in radiofrequency technologies.

Figure 7A:
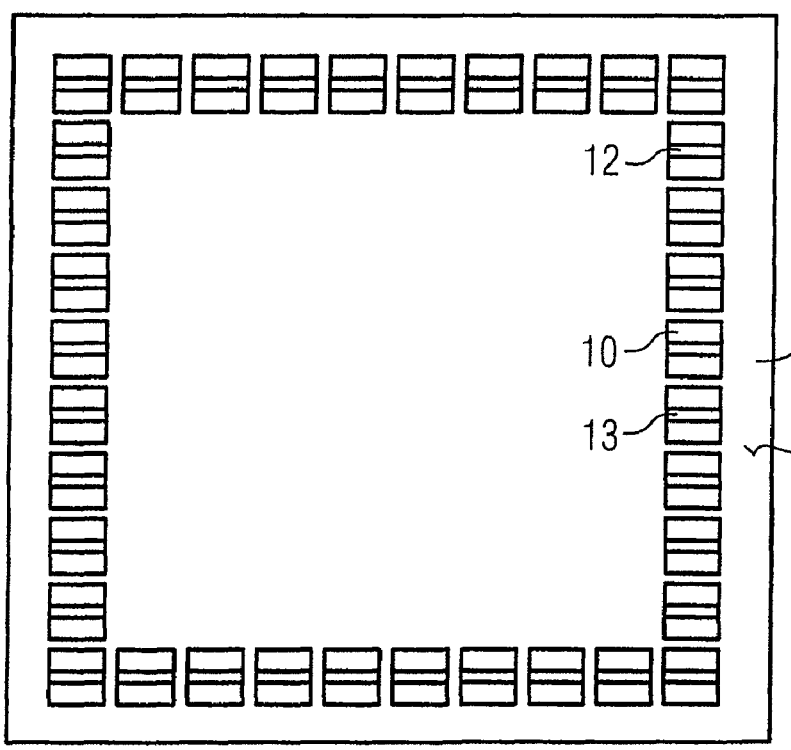
FIG. 7A shows in schematic plan view of a semiconductor chip to be stacked with a plurality of contact areas for the signal transmission of a semiconductor chip stack of a third embodiment.
Figure 7B:
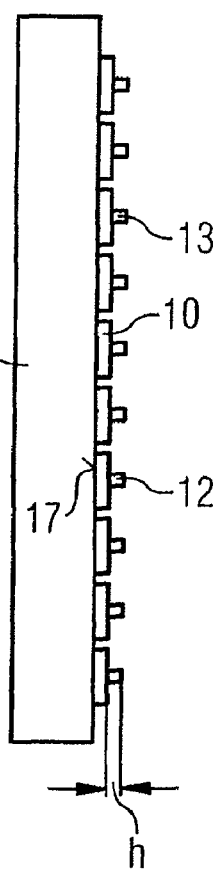
FIG. 7B shows a schematic side view of the semiconductor chip of FIG. 7A.

FIG. 7A shows a schematic plan view of a semiconductor chip 8 to be stacked with a plurality of contact areas 10 for signal transmission for a semiconductor chip stack of a third embodiment. FIG. 7B shows the corresponding side view in respect thereof. A multiplicity of contact areas 10 with external contact structures 12 in the form of ribs 13 are arranged on the surface 17 of the semiconductor chip 8 to be stacked. Since the areal extent of the contact areas 10 is small relative to the contact areas of a power semiconductor chip, only one rib 13 per contact area 10 is provided in this embodiment. The ribs 13 on the contact areas 10 of the semiconductor chip 8 to be stacked are all oriented in one direction, such that their profile can be seen in the side view in FIG. 7B.

FIG. 8A shows a schematic plan view of a base chip 7 with a plurality of contact areas 9 of a semiconductor chip stack for signal transmission in accordance with the third embodiment, and FIG. 8B shows a corresponding side view in respect thereof. In this case, too, respectively one rib 13 per contact area 9 is provided as external contact structure 11. However, these contact ribs 13 are arranged orthogonally with respect to the contact ribs 13 on the contact areas 10 of the semiconductor chip 8 to be stacked. A side view different than FIG. 7B is shown in FIG. 8b.

FIG. 9 shows a schematic cross section through a semiconductor chip stack 3 in accordance with the third embodiment of the invention in a region of the contact areas 9 and 10 shown in FIGS. 7 and 8. When the two semiconductor chips 7 and 8 are stacked one on top of another, the crossing ribs 13 of the two semiconductor chips 7 and 8 penetrate into one another and ensure that a reliable cohesive connection between the contact areas 9 and 10 leads to a connecting element 6, in which case greater tolerances for the warpage of the semiconductor chips 7 and 8 to be stacked can be permitted by virtue of the patterning of the surface of the contact areas 9 and 10.

FIG. 10A shows a schematic plan view of a semiconductor chip 8 to be stacked with contact areas 10 for a semiconductor chip stack in accordance with a fourth embodiment, and FIG. 10B shows a corresponding side view in respect thereof. The semiconductor chip 8 to be stacked with contact areas for the transmission of signals is the same or similar as the semiconductor chip 8 shown in FIG. 7A.

Figure 11A:
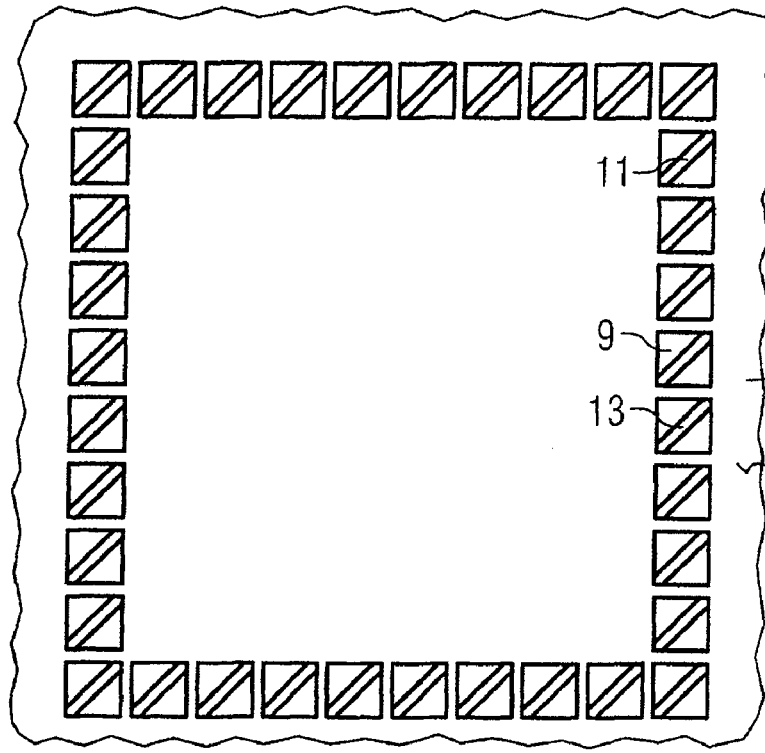
FIG. 11A shows a schematic plan view of a base chip with contact areas for a semiconductor chip stack in accordance with the fourth embodiment.
Figure 11B:
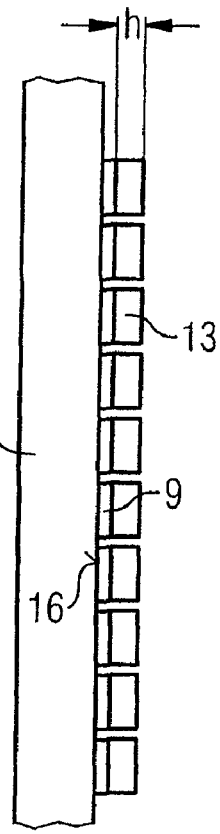
FIG. 11B shows a schematic side view of the base chip of FIG. 11A.

FIG. 11A shows a schematic plan view of a base chip 7 with contact areas 9 for a semiconductor chip stack of the fourth embodiment, and FIG. 11b shows a corresponding side view in respect thereof. The ribs 13 on the contact areas 9 of the base chip 7 are oriented diagonally on the contact areas 9, such that a wider contact area arises upon application of the semiconductor chip to be stacked which is shown in FIG. 10A.

Figure 12:
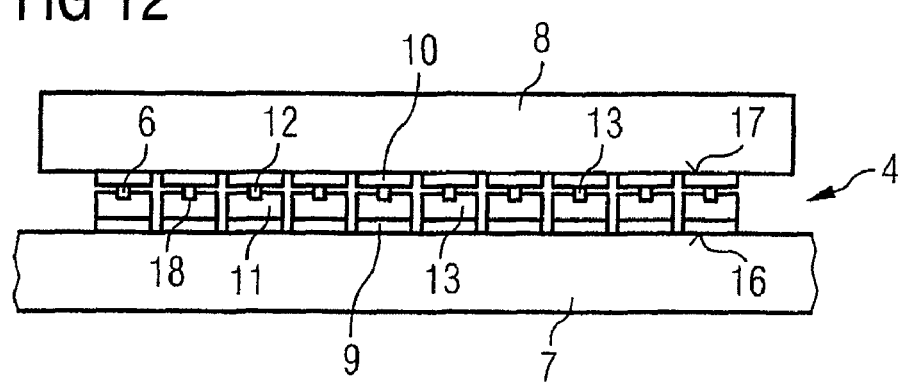
FIG. 12 shows a schematic cross section through a semiconductor chip stack formed with the chips of FIGS. 10 and 11.

FIG. 12 shows a schematic cross section through the semiconductor chip stack 17 in accordance with the fourth embodiment in the region of the contact areas 9 and 10 for signal transmission. The resultant connecting element 6 composed of the pairings of the contact areas 9 and 10 can advantageously be used for extremely high frequency applications, since the connecting paths are extremely short and since no bonding wires are required in order to produce connections between the semiconductor chips of the semiconductor chip stack. Such short connecting elements 6 minimize the risk of coupling in of interference fields for the semiconductor chip stack 4 in the extremely high frequency technology.

Figure 13A:
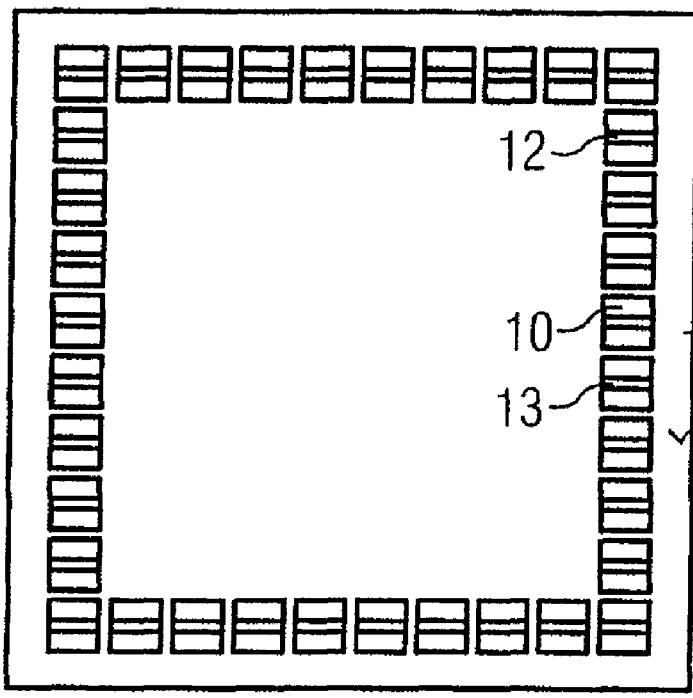
FIG. 13A shows a schematic plan view of a semiconductor chip to be stacked of a semiconductor chip stack of a fifth embodiment.
Figure 13B:
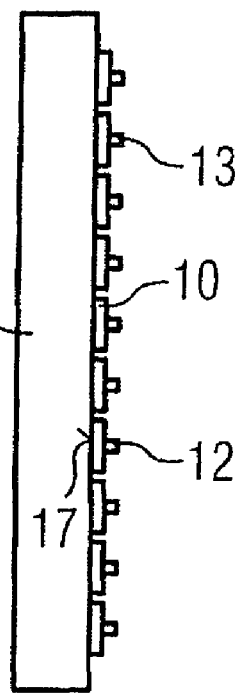
FIG. 13B shows a schematic side view of the semiconductor chip of FIG. 13A.

FIG. 13A shows a schematic plan view of a semiconductor chip 8 to be stacked of a semiconductor chip stack of a fifth embodiment, and FIG. 13B shows the corresponding side view in respect thereof. The areal extent of this semiconductor chip 8 to be stacked is smaller than that of the base semiconductor chip shown in FIG. 14.

Figure 14:
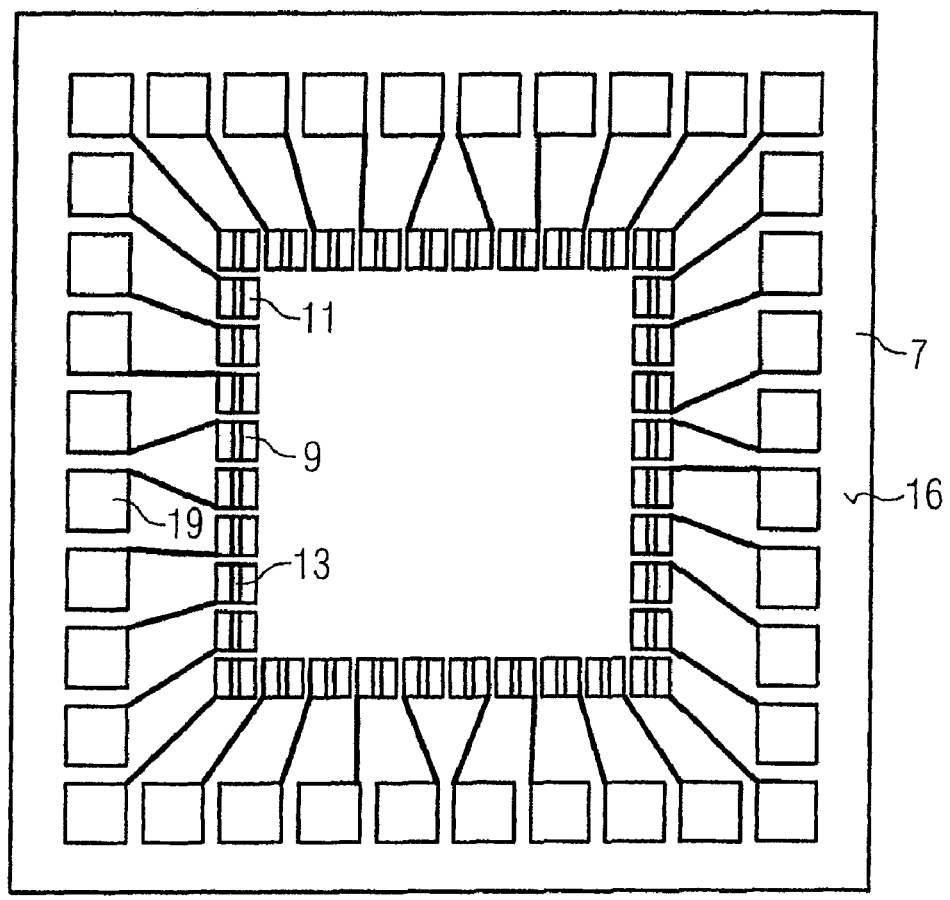
FIG. 14 shows a schematic plan view of a base chip with contact areas for a semiconductor chip stack in accordance with the fifth embodiment.

FIG. 14 shows a schematic plan view of a base chip 7 with contact areas 9 for a semiconductor chip stack in accordance with the fifth embodiment. The base semiconductor chip 7 has contact areas 9 which correspond in terms of arrangement and size to the contact areas 10 of the stacked semiconductor chip and likewise have an individual rib 13, which, however, are arranged orthogonally with respect to the ribs of the contact areas 10 of the semiconductor chip 8 to be stacked that is shown in FIG. 13A. In order to connect the semiconductor chip stack to a device carrier (not shown), this base semiconductor chip 7 includes bonding contact areas 19 on its top side 16 in edge regions, via which bonding contact areas the semiconductor chip stack can be connected to a device carrier, for example to a lead frame.

Figure 15:
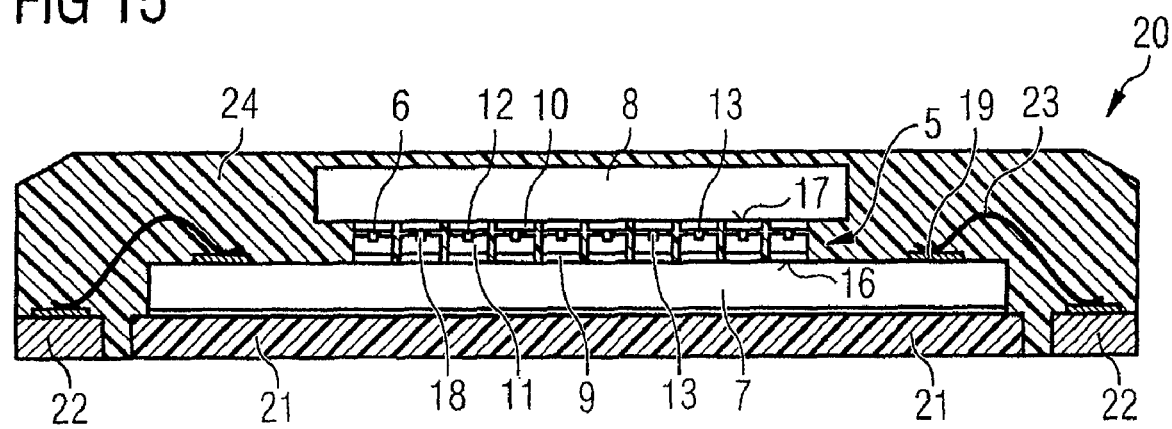
FIG. 15 shows a schematic cross section through a semiconductor chip stack formed with the chips of FIGS. 13 and 14.

FIG. 15 shows a schematic cross section through a semiconductor device 20 with a semiconductor chip stack 5 of the fifth embodiment. The semiconductor chips 7 and 8 shown in FIGS. 13 and 14 are stacked one on top of another by their patterned contact areas 9 and 10 to form new connecting elements 6 that arise through cohesive connection of crossing ribs 13. In order to produce the semiconductor component 20, the semiconductor chip stack 5 can be mounted on a lead frame as a device carrier 21, lead ends 22 as external contact of the semiconductor device 20 being arranged in the edge regions, which lead ends are electrically connected to the bonding contact areas 19 of the base chip 7 by bonding connections 23. In order to protect the components, in particular the semiconductor chip stack 5 with the bonding connections 22, the semiconductor chip stack 5 is embedded into a plastic housing composition 24 which also forms the external contour of the housing.

Figure 16:
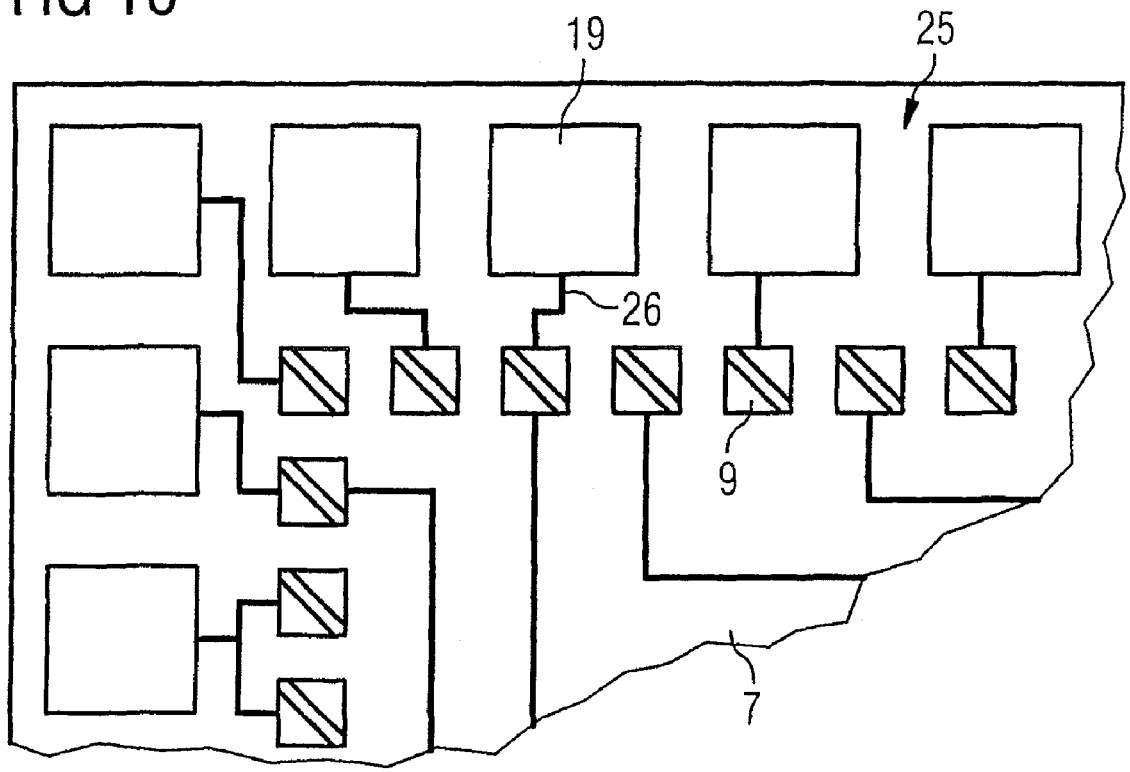
FIG. 16 shows a schematic plan view of a contact connection area pattern in which not all the patterned contact areas are led toward the outside.

FIG. 16 shows a schematic plan view of a contact connection pattern 25 on a partial region of a base chip 7 with "fan out" bonding contact areas 19 in edge regions of the base chip 7. In this case, not all the patterned contact areas 9 of the base chip 7 are connected to the bonding contact areas 19 via interconnects 26, but rather produce connections to other semiconductor chips (not shown) or serve for supporting the chip wiring.

Figure 17:
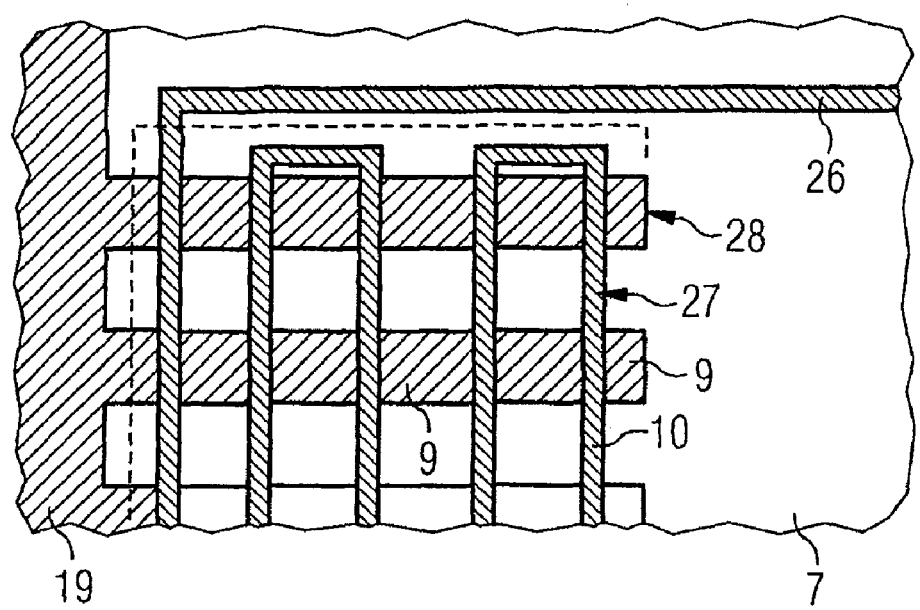
FIG. 17 shows a schematic plan view of a meandering rib structure of a contact area.

FIG. 17 shows a schematic plan view of a contact area 10 with a rib structure 27 of a stacked semiconductor chip that forms a meandering or looping (e.g., zig-zag) pattern, which is combined electrically via an interconnect 26. This is applied to a comb-shaped rib structure 28 of a contact area 9 of a base chip 7, the comb-shaped rib structure 28 being electrically connected by a large-area bonding area 19.

Figure 18:
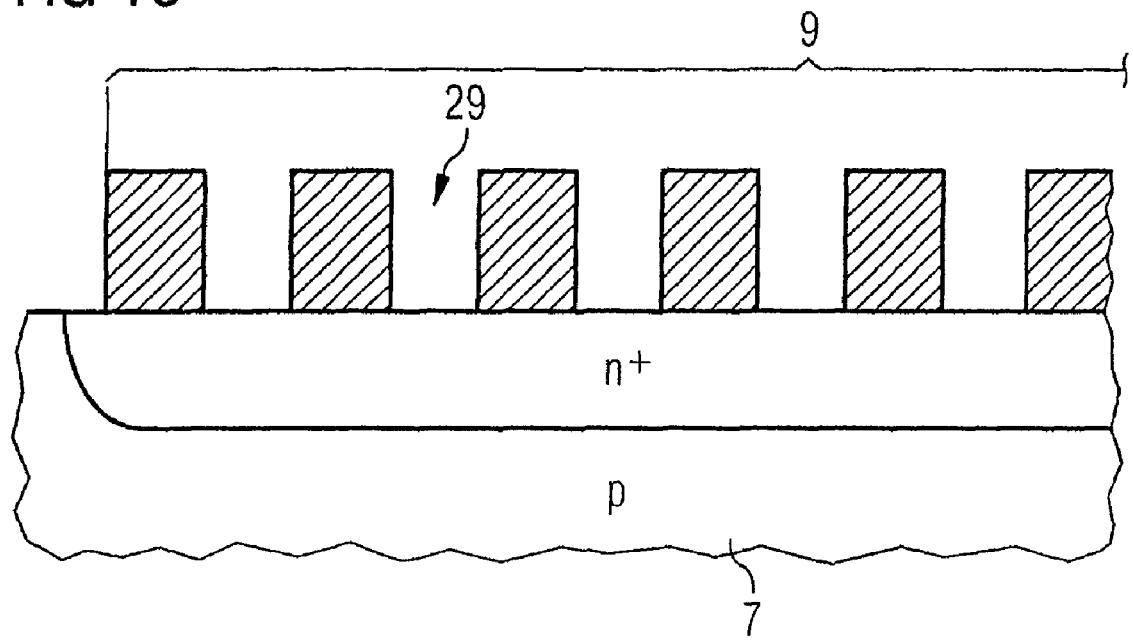
FIG. 18 shows a schematic cross section through a contact area with a trench structure etched throughout.
Figure 19:
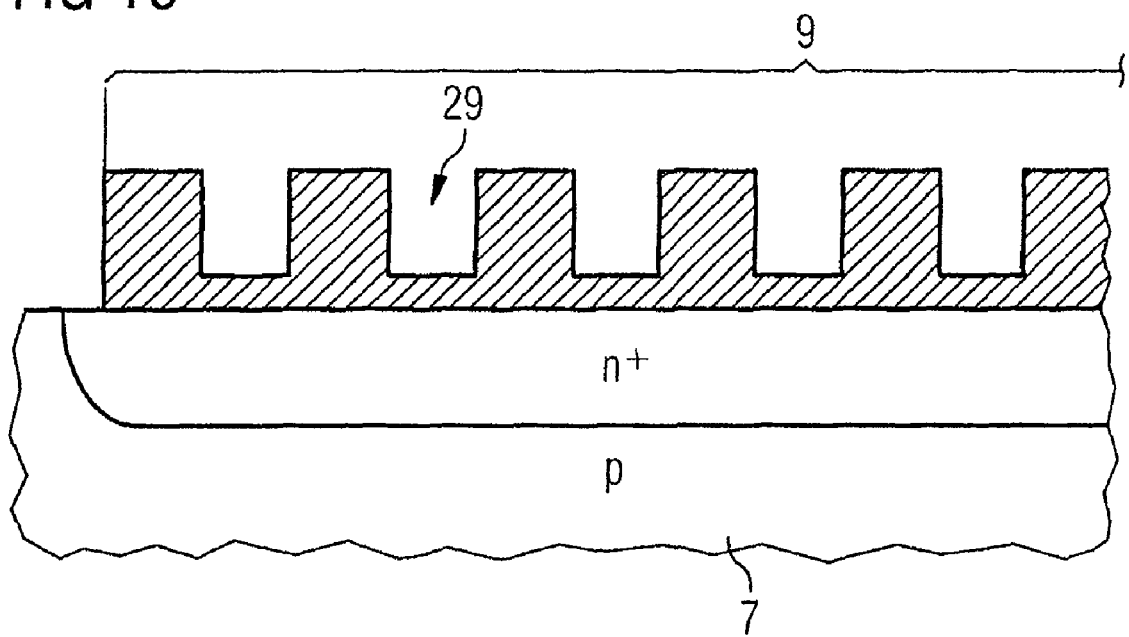
FIG. 19 shows a schematic cross section through a contact area with a partially introduced trench structure.

FIGS. 18 and 19 show differently patterned contact areas produced by introducing a trench structure. FIG. 18 shows a schematic cross section through a contact area 9 with a trench structure 29 etched throughout. By contrast, FIG. 19 shows a schematic cross section through a contact area 9 with an only partially introduced trench structure 29 (i.e., the trenches of the trench structure 29 of FIG. 19 are not as deep as the trenches of trench structure 29 shown in FIG. 18).

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed:

1. An electronic device comprising a component stack including at least two electronic components stacked one on top of the other with top sides of the components facing each other, wherein contact areas are arranged on the top sides of the components, the contact area for each component includes external contact structures comprising elongated rib and/or trench structures in which a length of each rib and/or trench structure is greater than a width of each rib and/or trench structure, and the two components are oriented with respect to each other with the rib and/or trench structures of one component being aligned transverse the rib and/or trench structures of the other component and with electrical connection elements being formed at intersection points between the rib and/or trench structures of the two components such that a single rib and/or trench structure of one component is in contact with a plurality of rib and/or trench structures of the other component.

2. The device of claim 1, wherein the components comprise semiconductor chips.

3. The device of claim 1, wherein the rib and/or trench structures of the contact areas of the two components stacked one on top of the other are oriented with respect to each other at an angle greater than 0° and no greater than 90°.

4. The device of claim 1, wherein at least one of the contact areas of the two components is configured to facilitate signal transmission and has a square or rectangular geometric configuration with at least one rib that is arranged diagonally on the square or rectangular contact area.

5. The device of claim 1, wherein at least one of the contact areas of the two components is configured to facilitate signal transmission and has a square or rectangular geometric configuration with at least one rib that is arranged parallel with a lateral edge of the square or rectangular contact area.

6. The device of claim 1, wherein the two components include corresponding contact areas to facilitate power transmission and include a plurality of ribs that intersect each other to form electrical connection elements.

7. The device of claim 1, wherein the contact areas of the components comprise an aluminum alloy.

8. The device of claim 7, wherein the aluminum alloy includes at least one of silicon and copper.

9. The device of claim 1, wherein the two components comprise a base component and a component stacked upon the base component, the contact areas of the base component comprise an aluminum alloy and the contact areas of the component stacked upon the base component comprise a gold alloy.

10. The device of claim 1, wherein the contact areas of the components further comprise adhesive layers from which the external contact structures project, and the projecting external contact structures of the components stacked one on top of the other intermesh such that the adhesive layers of the components are cohesively connected to each another.

11. The device of claim 1, wherein the external contact structures of at least one of the components includes tapered ribs having a cross-section that tapers from a base of each tapered to a free end of each tapered rib.

12. The device of claim 1, wherein the external contact structures include ribs that project from a surface of the contact areas a distance from 0.05 μm to 100 μm.

13. The device of claim 1, wherein the external contact structures include ribs that project from a surface of the contact areas a distance from 0.1 μm to 5 μm.

14. The device of claim 2, wherein the two stacked semiconductor chips include a base chip and a chip stacked upon the base chip, the base chip of the chip stack includes at least one of control circuits, supply circuits, logic circuits and memory circuits, and the chip stacked upon the base chip includes high frequency components.

15. The device of claim 2, wherein the device comprises one of an FET power switch and an FET bridge circuit, and a source connection or a drain connection of the device includes the contact areas with external contact structures including a plurality of ribs.

16. The device of claim 1, wherein the component stack comprises a base component and a component stacked upon the base component, the base component has an areal extent that is larger than the component stacked upon the base component, outer contact areas are located on the top side of the base component that are distant from a location at which the component is stacked upon the base component, and the outer contact areas include connecting elements that connect with a device substrate.

* * * * *